(12) United States Patent
Ohshima (10) Patent No.: US 6,313,690 B1
(45) Date of Patent: Nov. 6, 2001

(54) SEMICONDUCTOR SWITCHING DEVICE WITH LEAKAGE CURRENT DETECTING JUNCTION

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/502,008

(22) Filed: Feb. 11, 2000

(30) Foreign Application Priority Data

Feb. 14, 1999 (JP) .................................................. 11-074259
Feb. 9, 2000 (JP) .................................................. 12-032364

(51) Int. Cl.[7] .............................................. H03K 17/687
(52) U.S. Cl. ........................... 327/427; 327/434; 327/50; 323/283
(58) Field of Search .................................... 327/378, 375, 327/383, 389, 432, 50, 427, 434, 525; 307/125, 131; 361/53.1, 57, 87; 323/282, 283, 289

(56) References Cited

U.S. PATENT DOCUMENTS

| 4,720,997 | * | 1/1988 | Doak et al. | 327/512 |
| 4,851,954 | * | 7/1989 | Siiring | 327/513 |
| 5,408,694 | * | 4/1995 | Tran | 327/72 |
| 5,424,663 | * | 6/1995 | Wong | 327/561 |
| 5,646,520 |   | 7/1997 | Frank et al. | 324/158.1 |
| 5,796,278 | * | 8/1998 | Osborn et al. | 327/427 |
| 5,901,026 | * | 5/1999 | Furuno | 361/54 |
| 6,091,287 | * | 7/2000 | Salter et al. | 327/543 |
| 6,140,806 | * | 10/2000 | Gohara | 323/282 |
| 6,222,355 | * | 4/2001 | Ohshima et al. | 323/282 |
| 6,229,355 | * | 5/2001 | Ogasawara | 327/108 |

FOREIGN PATENT DOCUMENTS

| 0 747 713 A | 12/1996 | (EP) . |
| 0 814 395 A | 12/1997 | (EP) . |
| 1-227520 | 9/1989 | (JP) . |
| 2-266836 | 10/1990 | (JP) . |
| 3-262209 | 11/1991 | (JP) . |
| 4-134271 | 5/1992 | (JP) . |
| 5-52880 | 3/1993 | (JP) . |
| 6-27157 | 2/1994 | (JP) . |
| 6-61432 | 3/1994 | (JP) . |
| 6-188704 | 7/1994 | (JP) . |
| 6-244693 | 9/1994 | (JP) . |
| 9-145749 | 6/1997 | (JP) . |

* cited by examiner

Primary Examiner—Terry D. Cunningham
Assistant Examiner—Long Nguyen
(74) Attorney, Agent, or Firm—Finnegan, Henderson, Farabow, Garrett & Dunner, L.L.P.

(57) ABSTRACT

First main electrodes of second and third semiconductor elements are connected to the first main electrode of the first semiconductor element, control electrodes of the second and third semiconductor elements are connected to the control electrode of the first semiconductor element, a second main electrode of the second semiconductor element is connected to a first resistor, and a second main electrode of the third semiconductor element is connected to a second resistor. Second main-electrode voltages of the first and second semiconductor elements are compared with each other by a first comparator, a control voltage is supplied a control voltage to the control electrodes of the first and second semiconductor elements according to an output of the first comparator by control means. Second main-electrode voltages of the first and third semiconductor elements are compared with each other by a second comparator. The transistor widths of the second and third semiconductor elements are each smaller than the transistor width of the first semiconductor element. The first semiconductor element is connected to power supply elements in parallel with one another between a power source and a load, and a weak current is detected when the load and power supply elements are OFF. There is no shunt resistor when detecting an overcurrent or a weak current. Accordingly, a heat loss is minimized and detective sensitivity is improved.

2 Claims, 9 Drawing Sheets

SEMICONDUCTOR SWITCHING DEVICE WITH LEAKAGE CURRENT DETECTING JUNCTION

CROSS REFERENCE TO RELATED APPLICATIONS

The subject application claims benefit of the earlier filing dates of Japanese Patent Application Nos.Hei 11-74259 and 2000-32364 filed on Feb. 14, 1999 and Feb. 9, 2000 under the Paris Convention, the entire contents of which are incorporated by reference herein.

BACKGROUND OF THE INVENTION

1. Field of the Invention

The present invention relates to a semiconductor switching device provided with a weak-current detecting function.

2. Description of the Related Art

Figure 1:
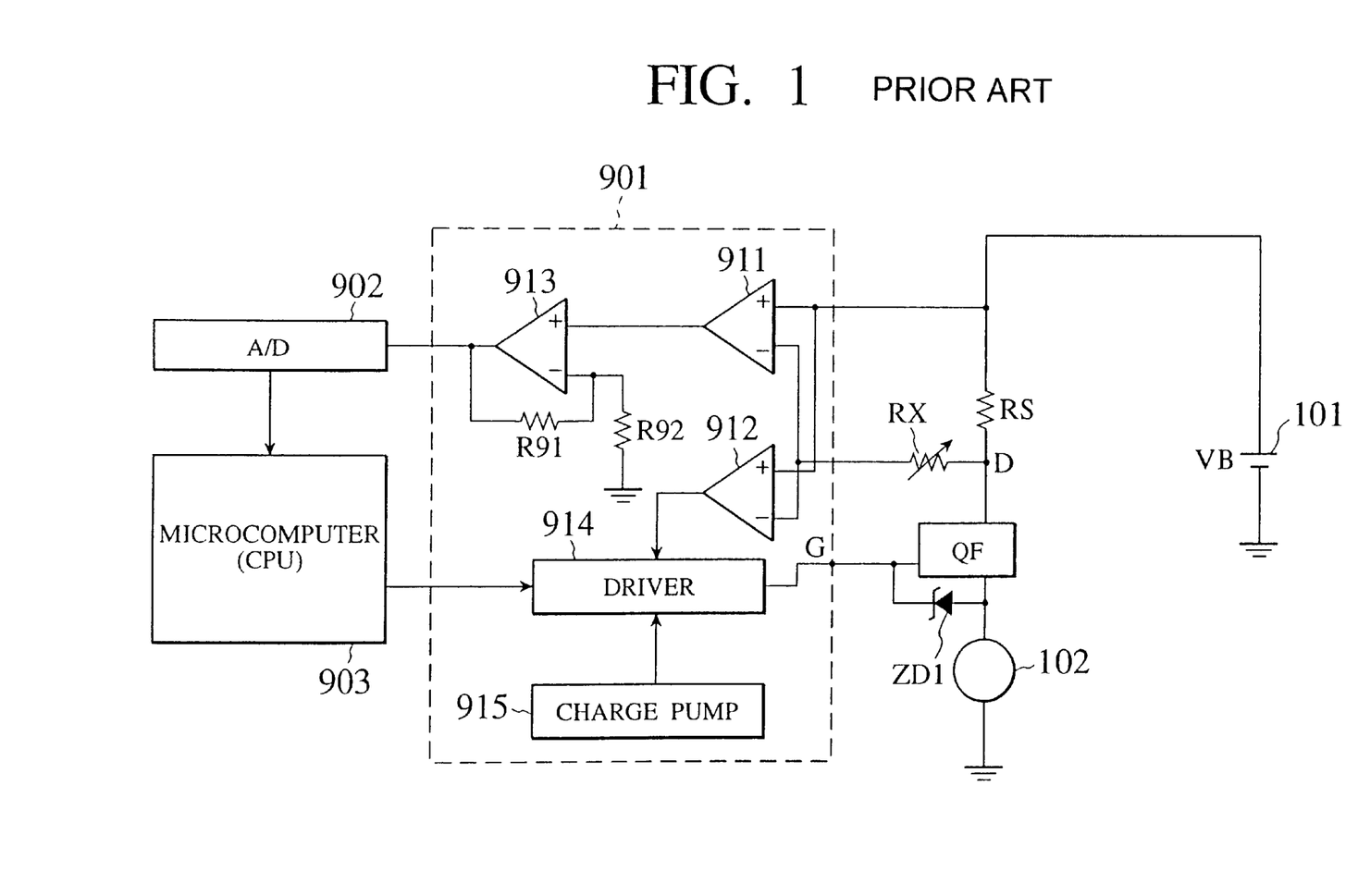
FIG. 1 is a circuit diagram showing a semiconductor switching device according to a prior art.

It may be shown as a conventional semiconductor switching device with a current detection function in FIG. 1. This switching device is installed between a power 101 and a load 102. This device has the structure which connected a shunt resistor RS with the switching device which consists of power FETs, etc. in series. Usual the shunt resistor and the switching device are included in the identical substrate. The current detection is carried out using the potential difference which arises in shunt resistor double end. The potential difference arises in the double end of shunt resistor RS, when load current flows. This potential difference is amplified in a differential amplifier 911 and a direct current amplifier 913. The amplified potential difference by going through an A/D converter 902, it is read in the microcomputer, and the microcomputer judges overcurrents and less currents, etc., Negligible currents such as the leakage current can be also detected in theory by this method. Since the value of the detection current is small, it becomes a problem that the detection sensitivity is raised. In the reason, the countermeasure of raising the amplification factor of the direct current amplifier 913 and the differential amplifier 911 and of raising the value of the shunt resistor is required. It becomes a problem that the exothermic reaction of the shunt resistor as a load current flowed increases, when the shunt resistor is increased. In addition, there is a problem that the voltage supplied for the load lowers, when the voltage drop which arises in the shunt resistor increases. In the meantime, there is a problem that the detection accuracy becomes bad, since an S/N ratio deteriorates, when an amplification factor of the differential amplifier 911 and direct current amplifier 913 is raised. In method using this shunt resistor, when the value of detecting negligible current decreases, this problem becomes difficult and the accomplishing goal becomes difficult.

Figure 2:
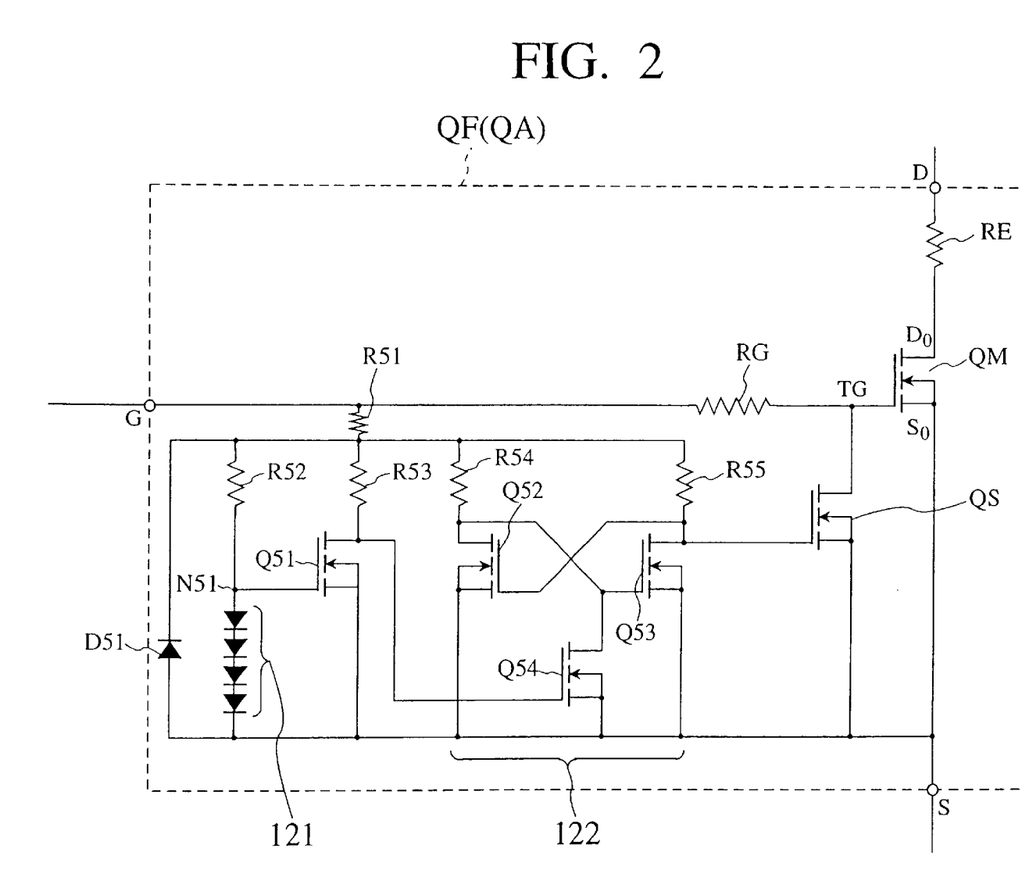
FIG. 2 is a circuit diagram showing a semiconductor element involving a temperature sensor.

An original function of the semiconductor switching device is to supply the electric power from the power source 101 in the load 102. Except for it, it has the function, namely the overcurrent protection function, when the trouble in which the wiring between the load 102 and the shunt resistor RS touched ground arose, which prevents that a large current flows for the wiring with the shunt resistor. It has the function which prevents that large current flows for the wiring with the shunt resistor. This overcurrent protection function becomes a essential, when the leakage current from the power line is measured using the shunt resistor. There is a case in which the semiconductor switching device contains heating and cutting off function. The semiconductor switching device contains a power element (main FET) QM, a resistor RG, a temperature sensor 121, a latch 122 and an overheat breaking element FETQS, as it is shown in FIG. 2. It has heating and cutting off function which compulsorily turns off temperature sensor built-in FETQF by containing gate interception circuit, when the junction temperature of FETQF rises until exceeding the regulation value. Namely, if the temperature sensor 121 detects that the temperature of the power element QM increases above the predetermined value, the latch 122 holds the increased temperature information to turn on the breaking element QS, which forcibly turns off the power element QM. The temperature sensor 121 consists of four diodes that are connected in series, are made of, for example, polysilicon, and are integrated in the vicinity of the power element QM. As the temperature of the power element QM increases, a forward voltage-drop of the four diodes of the temperature sensor 121 decreases. The gate potential of an FET Q51 drops to low, the FET Q51 changes from ON to OFF. This pulls up the gate potential of an FET Q54 to the potential of a gate control terminal G of the element QF, to change the FET Q54 from OFF to ON. As a result, the latch 122 latches "1" to provide an output of high. This output changes the breaking elements QS from OFF to ON to short-circuit the true gate TG and source S of the power element QM. Consequently, the power element QM changes from ON to OFF. Namely, the power element QM is turned off.

In FIG. 1, a zener diode ZD1 keeps a voltage of 12 V between the gate terminal G and source terminal S of the element QF and serves as a bypass for an overvoltage so that the overvoltage may avoid the true gate TG of the power element QM. The driver 901 has differential amplifiers 911 and 913 serving as a current monitor circuit, a differential amplifier 912 serving as a current limit circuit, a charge pump 915, and a driver 914. According to an ON/OFF control signal from the microcomputer 903 and an overcurrent signal from the current limit circuit, the driver 914 drives the true gate TG of the element QF. If an overcurrent exceeding an upper limit is detected through the differential amplifier 912 due to a voltage drop at the shunt resistor RS, the driver 914 makes the element QF nonconductive. If the current again decreases below the upper limit, the driver 914 makes the element QF conductive. On the other hand, the microcomputer 903 always monitors a current through the current monitor circuit made of the differential amplifiers 911 and 913, and if detects an abnormal current exceeding a normal value, makes the driver 914 turn off the element QF. If the temperature of the element QF exceeds a predetermined value before the microcomputer 903 issues an OFF instruction to the driver 914, the overheat breaking function mentioned above turns off the element QF.

The prior art must employ the shunt resistor RS connected to a power line in series, to detect a current in the power line. When a current supplied from a power source to a load through the power line is large, the shunt resistor RS causes a large heat loss that is unignorable.

To detect a weak current in the power line, the resistance value of the shunt resistor RS must be large. This, however, produces a large amount of heat when a large current is passed through the power line. To avoid this, the resistance value of the shunt resistor RS must be decreased, and then, it becomes difficult to detect a weak current in the power line.

The prior art detects a current in the power line according to a voltage drop at the shunt resistor RS. To achieve this, the prior art must have a current monitor circuit involving the shunt resistor RS, A/D converter 902, microcomputer 903, etc. These parts need a large space and are expensive, thereby increasing the size and cost of the switching device.

Even if the load controlled by the switching device is OFF, a leak current will flow if the power line between the load and the power source causes a grounding fault or a short circuit due to, for example, abrasion, moisture, or corrosion. If no measures are taken, the leak current will increase to cause a fire. It is strongly required, therefore, to monitor a weak leak current while the load is OFF.

SUMMARY OF THE INVENTION

An object of the present invention is to provide a semiconductor switching device having a weak-current detecting function, capable of detecting a weak leak current in a power line without a shunt resistor connected in series to the power line. This switching device minimizes a heat loss, is easy to integrate, and is manufacturable at low cost.

In order to accomplish the object, the present invention provides an apparatus for detecting a weak current, comprising a switching device that consists of a first semiconductor element having a first main electrode, a second main electrode and a control electrode, a second semiconductor element having a first main electrode connected to the first main electrode of the first semiconductor element, a control electrode connected to the control electrode of the first semiconductor element and a second main electrode connected to a first resistor, a first comparator for comparing second main-electrode voltages of the first and second semiconductor elements with each other, control means for supplying a control voltage to the control electrodes of the first and second semiconductor elements according to an output of the first comparator, a third semiconductor element having a first main electrode connected to the first main electrode of the first semiconductor element, a control electrode connected to the control electrode of the first semiconductor element and a second main electrode connected to a second resistor, and a second comparator for comparing second main-electrode voltages of the first and third semiconductor elements with each other. The transistor widths of the second and third semiconductor elements are each smaller than the transistor width of the first semiconductor element. The switching device is connected to power supply elements in parallel with one another between a power source and a load. The switching device is operated alone to detect a weak current when the load and power supply elements are OFF.

The first to third semiconductor elements may be FETs (field-effect transistors), SITs (static induction transistors), or BJTs (bipolar junction transistors). They may also be ESTs (emitter switched thyristors), MOS composite elements such as MCTs (MOS-controlled thyristors), or insulated-gate power elements such as IGBTs (insulated gate bipolar transistors). The semiconductor elements may be either of n- and p-channel types. The first main electrode is any one of emitter and collector electrodes in the case of BJTs and IGBTs, and any one of source and drain electrodes in the case of IGFETs such as MOSFETs or MOSSITs. The second main electrode is the other of the emitter and collector electrodes in the case of BJTs and IGBTs, and the other of the source and drain electrodes in the case of IGFETs. If the first main electrode is an emitter electrode, the second main electrode is a collector electrode, and if the first main electrode is a source electrode, the second main electrode is a drain electrode. The control electrode is a base electrode in the case of BJTs, or a gate electrode in the cage of IGBTs and IGFETs.

The power supply controller is a current oscillation switching circuit. The first semiconductor element of the power supply controller may be a power MOSFET. The present invention detects the difference between a terminal voltage of the first semiconductor element and a terminal voltage (reference voltage) of the second semiconductor element, and according to the difference, determines a deviation of the terminal voltage of the first semiconductor element, which is in the power supply path, from a normal level. This is equal to determining a deviation of a current passing through the power supply path from a normal current. By connecting the current oscillation switching circuits, i.e., the power supply controllers in parallel with one another, a large current will be handled. To detect a weak current, a reference voltage corresponding to the weak current may optionally be set.

The present invention needs no current-detecting shunt resistor of the prior art in a power supply path, thereby suppressing a heat loss. The present invention is capable of responding to not only an overcurrent due to a dead short but also an abnormal current due to an incomplete short circuit such as layer short that involves a certain extent of short-circuit resistance. The present invention detects an overcurrent without a shunt resistor and carries out ON/OFF control of the semiconductor elements with a hardware circuit without a microcomputer, thereby reducing the space and cost of the switching device.

The weak-current detector is also a current oscillation switching circuit provided with a weak-current detecting function. In the following explanation, the power supply controller, weak-current detector, and current oscillation switching circuit are equally handled.

The effect of the present invention improves in case that an ON resistance value provided when the switching device is operated alone is set to be greater than an ON resistance value provided when the power supply elements are operated alone. This increases a voltage generated in the switching device, thereby improving the detecting accuracy of a weak current.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 3:
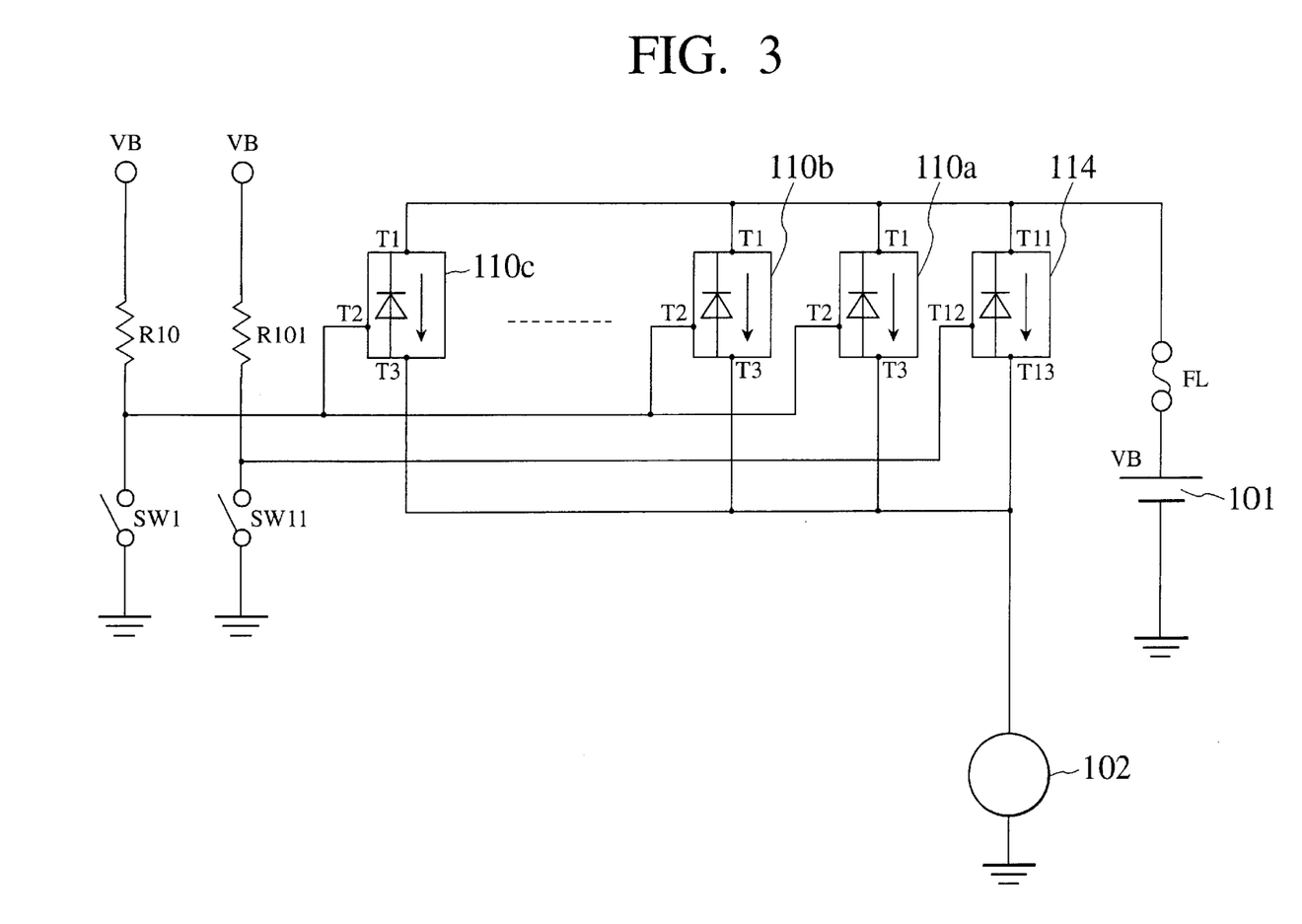
FIG. 3 is a circuit diagram showing a switching device according to an embodiment of the present invention.

FIG. 3 shows a switching device according to an embodiment of the present invention. The switching device has current oscillation switching circuits or power supply controllers 110a to 110c for passing a current to drive a load 102 and a current oscillation switching circuit or a weak-current detector 114 for detecting a weak current such as a leak current. The switching circuits 110a to 110c and 114 are connected in parallel with one another and are arranged in a path between the load 102 are a power source VB. The switching circuits 110a to 110c have terminals T2 connected to a switch SW1 and a resistor R10. The other end of the switch SW1 is grounded, and the other end of the resistor R10 is connected to the power source VB. A terminal T12 of the switching circuit 114 is connected to a switch SW11 and a resistor R101. The other end of the switch SW11 is grounded, and the other end of the resistor R101 is connected to the power source VB. When the switch SW1 is ON, the switching circuits 110a to 110c are conductive. Each load 102 incorporates a switch, and when this switch is ON, the load 102 passes a current. If the load 102 is entirely OFF, no normal load current flows even if the switch SW1 is ON. Under this state, the switch SW1 is turned off and the switch SW11 on, to turn off the switching circuits 110a to 110c and on the switching circuit 114. The switching circuit 114 will pass no current if there is no leak current in the line between the switching circuit 114 and the load 102 or in the load 102 itself. If there is a leak current in the line between the switching circuit 114 and the load 102 or in the load 102 itself, the switching circuit 114 will pass the sum of such leak currents, which is detectable. The number of parallel-connected switching circuits 110a to 110c is dependent on a current to be passed to the load 102, etc. When a large current is passed to the load, the number of switching circuits is increased to reduce a voltage drop in the switching device. A fuse FL of FIG. 3 is not always required.

If the switch SW1 is ON and the switch SW11 OFF, the terminals T1 and T3 of the switching circuits 110a to 110c are conductive to apply the power source voltage to the load 102. Each load 102 has its own switch, which is turned on to drive the load 102 and is turned off to stop the load 102 irrespective of the power source voltage. Namely, the switching circuits 110a to 110c serve to apply the power source voltage to the load 102 and are not intended to switch on and off the load 102. If the switch SW1 is OFF and SW11 ON, the terminals T1 and T3 of the switching circuits 110a to 110c become nonconductive, to stop the power source voltage to the load 102. At this time, if the switch of the load 102 itself is OFF, a current flowing between the terminals T11 and T13 of the switching circuit 114 is only a leak current from the load 102. The switching circuit 114 compares the leak current with a reference value and provides a resultant signal. If the switch of the load 102 itself is ON, a load driving current overlaps the leak current, and the overlapping currents flow to the switching circuit 114. Then, the switching circuit 114 is unable to detect the leak current.

The switching circuits 110a to 110c serve to minimize a voltage drop with respect to a load current. If the switching circuits 110a to 110c are ON when detecting a leak current, the leak current is distributed to the switching circuits 110a to 110c and becomes very weak. Then, it is very difficult for the switching circuit 114 to detect the leak current. To avoid this and to fully pass a leak current to the switching circuit 114, the present invention employs the circuit configuration mentioned above.

Figure 4:
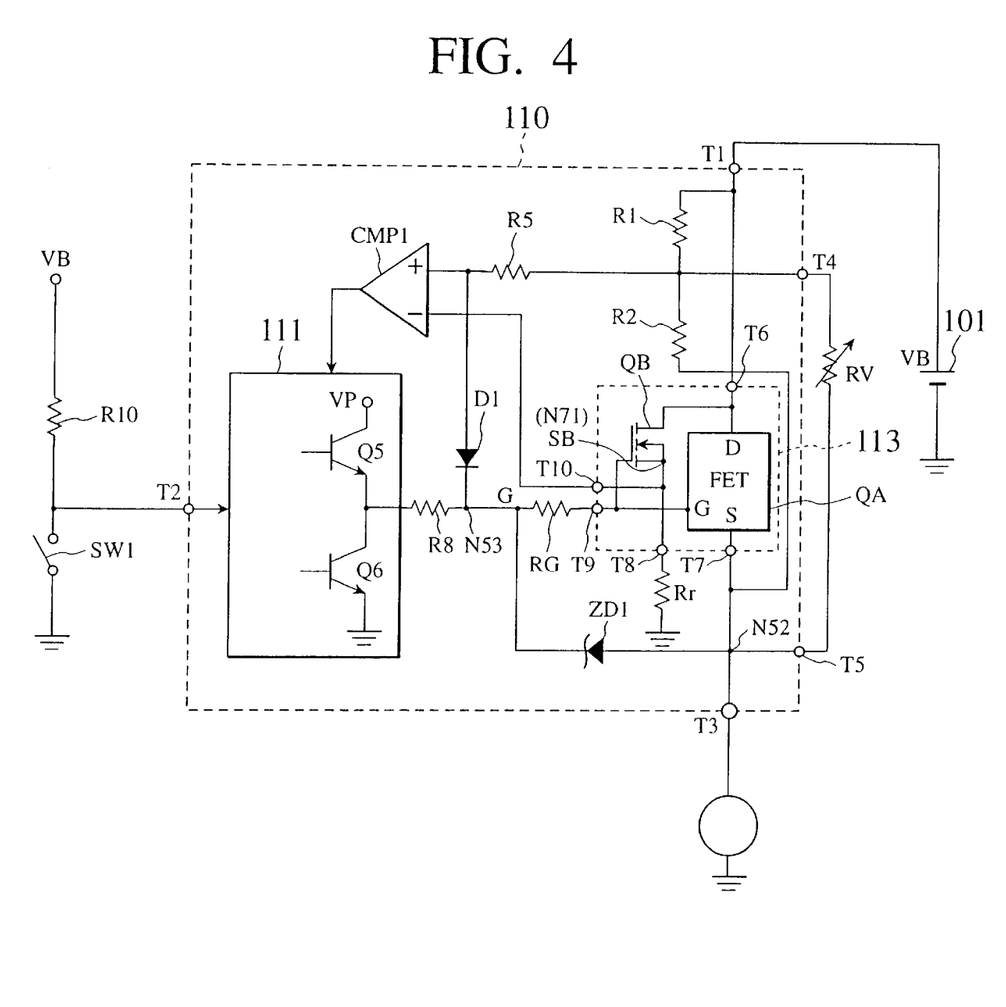
FIG. 4 is a circuit diagram showing a current oscillation switching circuit serving as a power supply controller in the switching device of the present invention.

FIG. 4 is a circuit diagram showing a current oscillation switching circuit 110 employed by the switching device of the present invention. The switching circuit 110 of FIG. 4 corresponds to any one of the switching circuits 110a to 110c of FIG. 3. The switching circuit 110 has a first semiconductor element QA serving as a main power element, and a controller. The controller detects an abnormal current flowing to the first semiconductor element QA, turns on and off the first semiconductor element QA in response to the abnormal current, to cause current oscillations to break a conductive state of the first semiconductor element QA. The first semiconductor element QA and controller are integrated on a single substrate. The first semiconductor element QA and controller may form a hybrid IC employing an insulating substrate made of ceramics or glass epoxy, or an insulating metal substrate. Preferably, the first semiconductor element QA and controller are integrated into a monolithic power IC formed on a single semiconductor substrate (a single chip).

The power IC is connected between the power source 101 for supplying an output voltage VB and the load 102 such as a lamp. In FIG. 4, the first semiconductor element QA serving as a main element of the switching circuit 110 has a function of sensing heat and breaking the switching circuit 110 in response to the sensed heat. The first semiconductor element QA of FIG. 4 may be that of FIG. 2 involving a temperature sensor. In the following explanation, the first semiconductor element QA is that of FIG. 2 associated with a temperature sensor. The sensing and breaking function is not needed. The first semiconductor element QA has a first main electrode, second main electrode, and control electrode. The first semiconductor element QA may be a power MOSFET of, for example, DMOS structure, VMOS structure, or UMOS structure, or a MOSSIT having a similar structure. The first semiconductor element QA may be a MOS composite element such as an EST or an MCT, or an insulated gate power element such as an IGBT. If the gate of the first semiconductor element QA is always with a reverse bias, the first semiconductor element QA may be a junction FET, a junction STI, or a SI thyristor. The first semiconductor element QA may be of any one of n-and p-channel types. Namely, the current oscillation switching circuit 110 may be of an n-channel type or a p-channel type.

In FIG. 4, the switching circuit 110 is of an n-channel and is monolithically formed on a single semiconductor substrate. The switching circuit 110 consists of the first semiconductor element QA and second semiconductor element QB that is connected in parallel with the first semiconductor element QA. The second semiconductor element QB serves as a reference element and may be an FET. The switching circuit 110 also has a comparator CMP1 for comparing a main electrode voltage of the first semiconductor element QA with a main electrode voltage of the second semiconductor element QB, and a driver 111 for supplying a control voltage to the control electrodes of the first and second semiconductor elements QA and QB. Each of the first and second semiconductor elements QA and QB has first and second main electrodes. The main electrode is any one of the emitter and collector regions of an IGBT, or any one of the source and drain regions of a power IGFET such as a power MOSFET or a power MOSSIT. The second main electrode is the other of the emitter and collector regions, or the other of the source and drain regions. If the first main electrode is an emitter region, the second main electrode is a collector regions, and if the first main electrode is a source region, the second main electrode is a drain region. The control electrode is a gate electrode in IGBT or power IGFET. The first and second semiconductor elements QA and QB have similar current-voltage characteristic curves and the same main and control electrode configurations.

In this embodiment, the first semiconductor element QA is that of FIG. 2 associated with a temperature sensor. In FIG. 2, the first semiconductor element QA has a power element QM which is a power FET, a resistor RG connected to a true gate TG of the power element QM, a temperature sensor 121, an FET Q51 whose gate is connected to the temperature sensor 121, a latch 122 connected to the output side of the FET Q51, and an overheat breaking element QS which is an FET whose gate is connected to the output side of the latch 122. The output side of the breaking element QS is connected to the true gate of the power element QM. The power element QM may be a multi-channel power element consisting of a plurality of unit cells. The power element QM is connected in parallel with the second semiconductor element QB. Namely, the second semiconductor element QB is arranged in the vicinity of the first semiconductor element QA. The second semiconductor element QB may have no temperature sensor, latch, or overheat breaking element. Since the second semiconductor element QB is formed adjacent to the power element QM in the same process, no variation will be involved in the electric characteristics of the second semiconductor element QB and power element QM due to temperature drift or lot irregularities. The current capacity of the second semiconductor element QB is set to be smaller than that of the power element QM by adjusting the number of parallel-connected unit cells in the second semiconductor element QB. For example, the second semiconductor element QB has one unit cell, while the power element QM is composed of 1000 unit cells. In this case, the ratio of the channel width of the second semiconductor element QB to that of the power element QM is 1:1000. The temperature sensor 121 consists of diodes connected in series. These diodes are formed from, for example, a polysilicon thin film deposited on an interlayer insulation film formed on the second semiconductor element QB and power element QM. The temperature sensor 121 is integrated around a channel region of the power element QM. As the temperature of the power element QM increases, a forward voltage-drop of the four diodes of the temperature sensor 121 decreases. This drops the gate potential of an FET Q51 to low to change the FET Q51 from ON to OFF. This pulls up the gate potential of an FET 54 to the potential of a gate control terminal G of the first semiconductor element QA, to change the FET Q54 from OFF to ON. Then, the latch 122 latches "1" and provides an output of high level to change the overheat breaking element QS from OFF to ON. As a result, the change makes to short-circuit the true gate TG and source S of the power element QM. Namely, the power element QM changes from ON to OFF. In this way, the power element QM is interrupted due to overheat.

Returning to FIG. 4, the current oscillation switching circuit 110 has a second semiconductor element QB, resistors R1, R2, R5, R8, RG, Rr, a zener diode ZD1, a diode D1, the comparator CMP1, and the driver 111. These parts and the first semiconductor element QA are monolithically formed on the same semiconductor substrate. The zener diode ZD1 keeps a voltage of 12 V between the gate terminal G and source terminal S of the first semiconductor element QA to bypass an overvoltage so that the overvoltage may not be applied to the true gate TG of the power element QA. A resistor R10 and a switch SW1 are arranged outside the switching circuit 110. It is desirable that the resistor Rr is arranged outside the switching circuit 110.

The driver 111 has a source transistor Q5 whose collector is connected to a potential VP and a sink transistor Q6 whose emitter is connected to a ground potential GND. The transistors Q5 and Q6 are connected in series. In response to an ON/OFF signal from the switch SW1, the transistors Q5 and Q6 are turned on and off to supply a drive control signal to the control electrodes of the first and second semiconductor elements QA and QB. The driver 111 in FIG. 4 consists of BJTs. Instead, the driver 111 may be made of MOSFETs. Forming the driver 111 with MOSFETs involves simple MOSFET manufacturing processes, thereby simplifying the manufacturing of the current oscillation switching circuit 110. Forming the driver 111 with BJTs involves BIMOS manufacturing processes. The output voltage VB of the power source 101 is, for example 12 V, and the charge pump output voltage VP is, for example, VB+10 V.

The first main electrode (drain) of the first semiconductor element QA and the first main electrode (drain) of the second semiconductor element QB are connected to each other and are maintained at a common potential. The second main electrode (source) of the second semiconductor element QB is connected to a first resistor or a reference resistor Rr. The resistance of the reference resistor Rr is determined according to the ratio of the channel width of the second semiconductor element QB to that of the power element QM. For example, the ratio of the channel width of the second semiconductor element QB to that of the first semiconductor element QA is 1:1000. In this case, the resistance of the reference resistor Rr is set to be 1000 times larger than the resistance of the load 102 under an overload state. Then, the second semiconductor element QB will generate a drain-source voltage $V_{DS}$ corresponding to an overload current that is caused by an abnormal operation and flows to the first semiconductor element QA.

Between the first main (drain) and second main (source) electrodes of the first semiconductor element QA, there are resistors R1 and R2 connected in series. A main electrode voltage (source-drain voltage) $V_{DS}$ of the first semiconductor element QA is divided by the resistors R1 and R2, and the divided voltage is passed through the resistor R5 to a positive input terminal of the comparator CMP1. A negative input terminal of the comparator CMP1 receives a source voltage VS of the second semiconductor element QB. If potential at the positive input terminal of the comparator CMP1 is greater than potential at the negative input terminal thereof, the comparator CMP1 provides an output of high level, and therefore, the driver 111 provides a voltage to the gates controlled by the driver 111. If potential at the positive input terminal of the comparator CMP1 is smaller than potential at the negative input terminal thereof, the comparator CMP1 provides an output of low level, and therefore, the driver 111 turns off the gates controlled by the driver 111. The comparator CMP1 has predetermined hysteresis.

Figure 5:
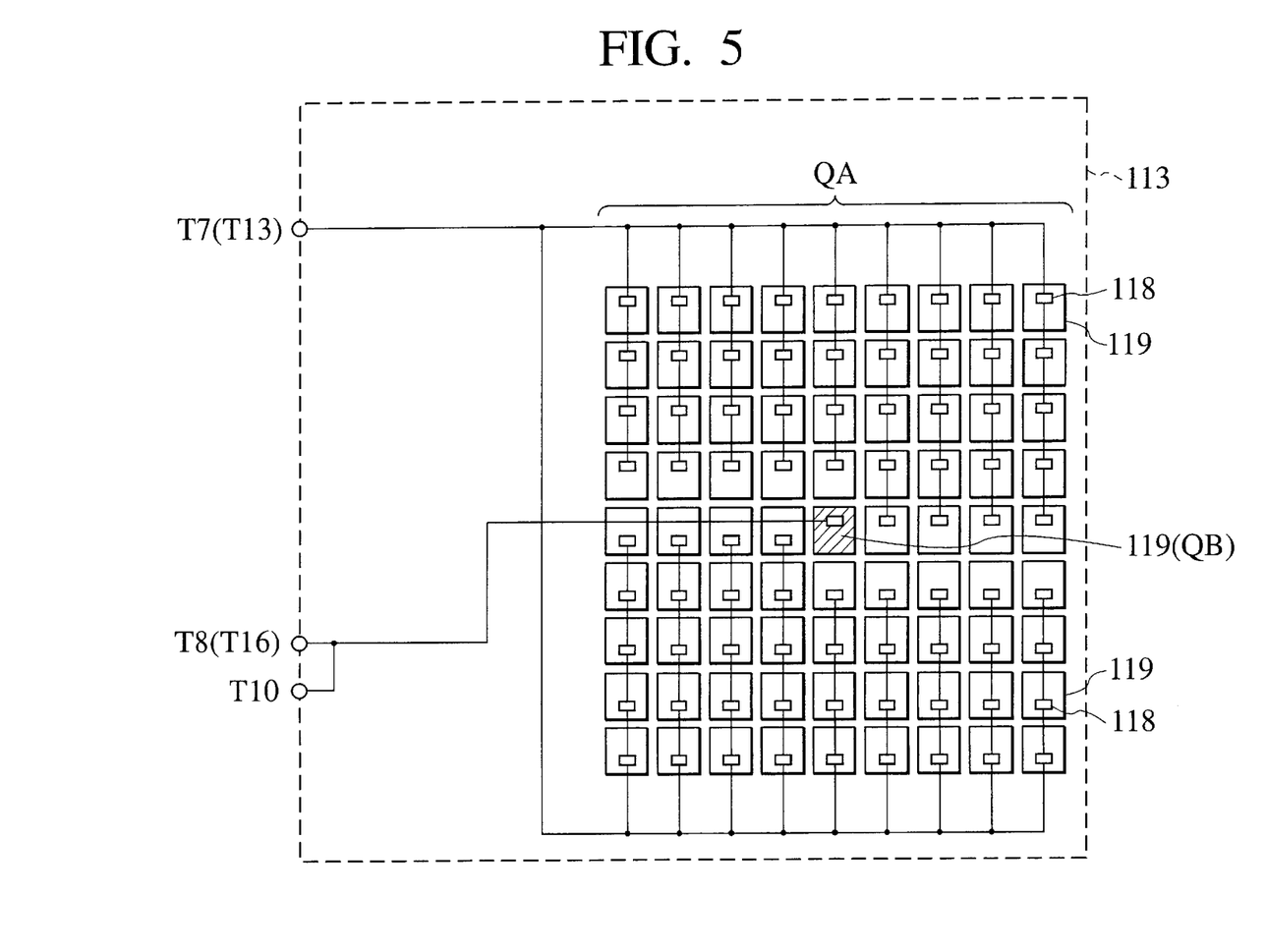
FIG. 5 shows an essential part of the current oscillation switching circuit formed on a single chip according to the present invention.

FIG. 5 shows a minimum essential area of the current oscillation switching circuit of the switching device according to the present invention. The minimum area 113 includes the first semiconductor element QA and second semiconductor element QB which are made of identical transistor cells 119. Gate electrodes (not shown) of the transistor cells 119 are collectively connected to a terminal T9 of FIG. 4. Drain electrodes (not shown) of the transistor cells 119 are collectively connected to a terminal T6 of FIG. 4. The first semiconductor element QA consists of 80 transistor cells 119 whose source electrodes 118 are collectively connected to a terminal T7. The second semiconductor element QB consists of one transistor cell 119 whose source electrode 118 is connected to terminals T8 and T10.

In FIG. 5, the ratio of the number of cells in the second semiconductor element QB to that in the first semiconductor element QA is 1:80. Instead, the ratio may be 1:1000. In this case, an integer multiple of 1001, for example, 1001 or 4004 transistor cells are arranged in a matrix. In FIG. 5, the 81 cells 119 are arranged adjacent to one another on a single chip so that they may simultaneously be processed. Then, even if manufacturing conditions fluctuate process by process, the cells may be processed under the same fluctuating conditions, to have an identical structure. Arranging the cells adjacent to one another on a single chip may provide the cells with an equal structure even if a manufacturing machine involves process unevenness chip by chip. The cell 119 serving as the second semiconductor element QB is positioned at the center of the 81 cells, so that the second semiconductor element QB may have a mean electric characteristic among the 81 cells 119. If the electric characteristics of the cells 119 involve positions dependency over the chip, the central cell may have a mean electric characteristic.

When the first semiconductor element QA is turned on to pass a current therethrough, the 80 cells 119 of the element QA generate heat. Even if the cells equally generate heat, there will be a temperature difference between a peripheral cell and the central cell. This temperature difference causes an electric characteristic difference. It is preferable that the cell 119 for the second semiconductor element QB has the same temperature and electric characteristic as the cells for the first semiconductor element QA. Accordingly, the cell 119 for the second semiconductor element QB must not be arranged at the periphery of the area 113 where the temperature is low. A current passing through the cell 119 for the second semiconductor element QB is substantially equal to a current passing through the cells 119 for the first semiconductor element QA, and therefore, heat generated by the cell 119 for the second semiconductor element QB is substantially equal to that generated by any one of the cells 119 for the first semiconductor element QA. In the operation as a weak-current detecting detecting element, there is no problem of the exothermic reaction, because the current is small.

Figure 6:
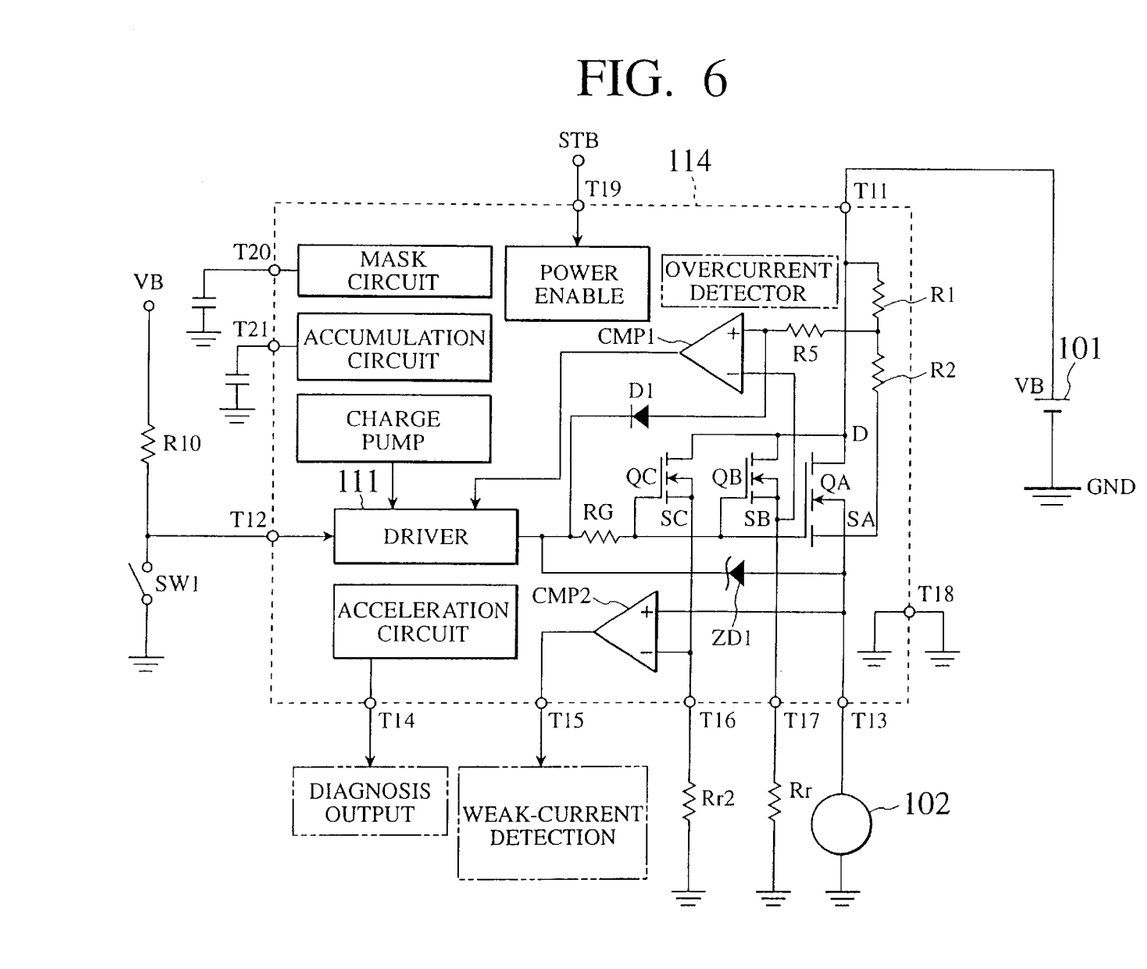
FIG. 6 is a circuit diagram showing a current oscillation switching circuit serving as a weak-current detector in the switching device of the present invention.

FIG. 6 shows the details of the current oscillation switching circuit 114 having a function for detecting a weak current such as a leak current, of the switching device of the present invention. Compared with the structure of FIG. 4, the structure of FIG. 6 additionally has a semiconductor element QC, a resistor Rr2, and a comparator CMP2, to form a weak-current detector. The resistance value of the resistor Rr2 is determined by multiplying a load resistance value, which corresponds to a leak-current reference value, by a channel width ratio. For example, if the leak-current reference value is 60 mA under a power source voltage of 12 V, the corresponding load resistance value is 200 Ω. If the channel width ratio is 1:1000, the resistance value of the resistor Rr2 is determined as 200 KΩ. The larger the resistance value of the resistor Rr2, the greater the sensitivity of detecting a leak current. The drain and gate of the element QC are connected to the drain and gate of a first semiconductor element QA, respectively. The source of the element QC is connected to a terminal of the resistor Rr2. The other end of the resistor Rr2 is grounded. A positive input terminal of the comparator CMP2 receives a source voltage from the first semiconductor element QA, and a negative terminal thereof receives a source voltage from the element QC. If the voltage to the negative terminal is smaller than that to the positive terminal, the comparator CMP2 provides an output of high level to indicate that a voltage drop at the first semiconductor element QA is small and that a weak current such as a leak current to be detected is below a reference value. If the voltage to the negative terminal is higher than that to the positive terminal, the comparator CMP2 provides an output of low level to indicate that a voltage drop at the first semiconductor element QA is large and that a weak current to be detected is above the reference value. Increasing the resistance of the resistor Rr2 decreases a voltage drop at the element QC to make the reference value for a weak current smaller, thereby improving the detecting sensitivity of a leak current. An area 114 surrounded with a dotted line in FIG. 6 is an analog-integrated chip area.

The elements QA and QC of FIG. 6 are essential parts for the current oscillation switching circuit 114 having the function of detecting a weak current, of the switching device of the present invention. The elements QA and QC of FIG. 6 are formed in one chip. The structure of the elements QA and QC of FIG. 6 is the same as that of the elements QA and QB of FIG. 5 with the element QB being replaced with the element QC. Namely, the elements QA and QC are formed of identical transistors 119 that are connected as shown in FIG. 5. According to a difference ΔID between a weak current (leak current) and the reference value, as well as an ON resistance value Ron of the element QA, the comparator CMP2 detects a value of ΔID×Ron. If the difference ΔID is unchanged, a produced voltage increases as the ON resistance value Ron increases, thereby improving a weak current detecting sensitivity. To increase the ON resistance value Ron, the number of cells 119 that form the element QA may be reduced, the channel length of each cell 119 may be elongated to increase the ON resistance of the cell 119, or an impurity concentration may be decreased to increase the resistance of a semiconductor substrate. The switching circuit 114 is arranged as shown in FIG. 3. Since the switching circuit 114 needs no power supply, the ON resistance value Ron may be increased to improve the weak current detecting sensitivity.

In FIG. 6, a zener diode ZD1 keeps a voltage of 12 V between the gate terminal G and source terminal S of the element QA to bypass an overvoltage so that the overvoltage may not be applied to the true gate TG of a power element QM integrated in the element QA (FIG. 2).

Figure 7:
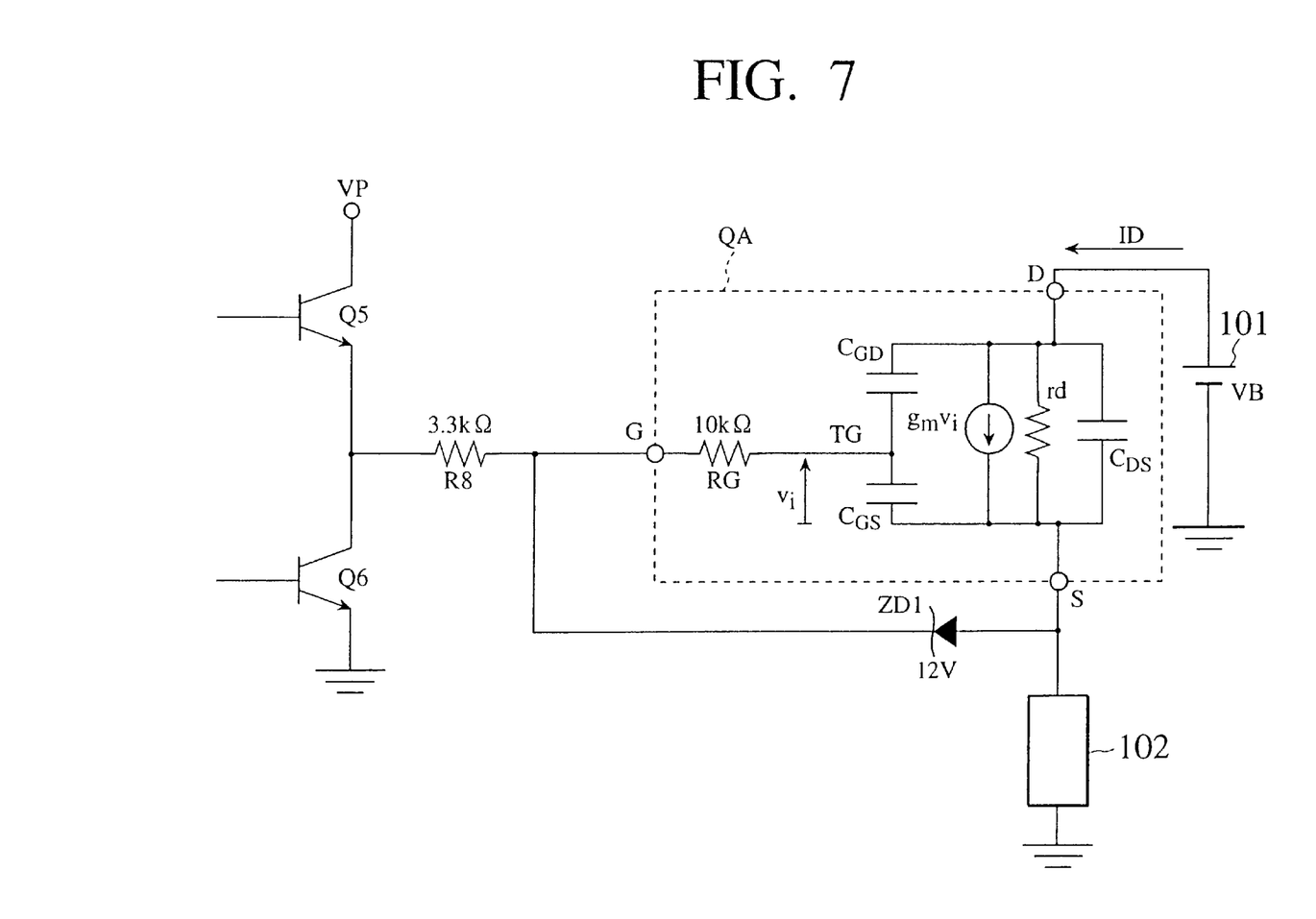
FIG. 7 is an equivalent circuit diagram schematically showing a first semiconductor element in the current oscillation switching circuit of the present invention.

FIG. 7 is an equivalent circuit diagram showing the first semiconductor element QA of the current oscillation switching circuit of the present invention. The element QA is represented with an equivalent current source $g_m V_1$, drain resistance rd, gate-source capacitance $C_{GS}$, gate-drain resistance $C_{GD}$, and drain-source resistance $C_{DS}$. The equivalent circuit of FIG. 7 shows a power supply path from the power source 101 to the load 102. The load 102 includes wiring inductance LU and wiring resistance RU.

Figure 8:
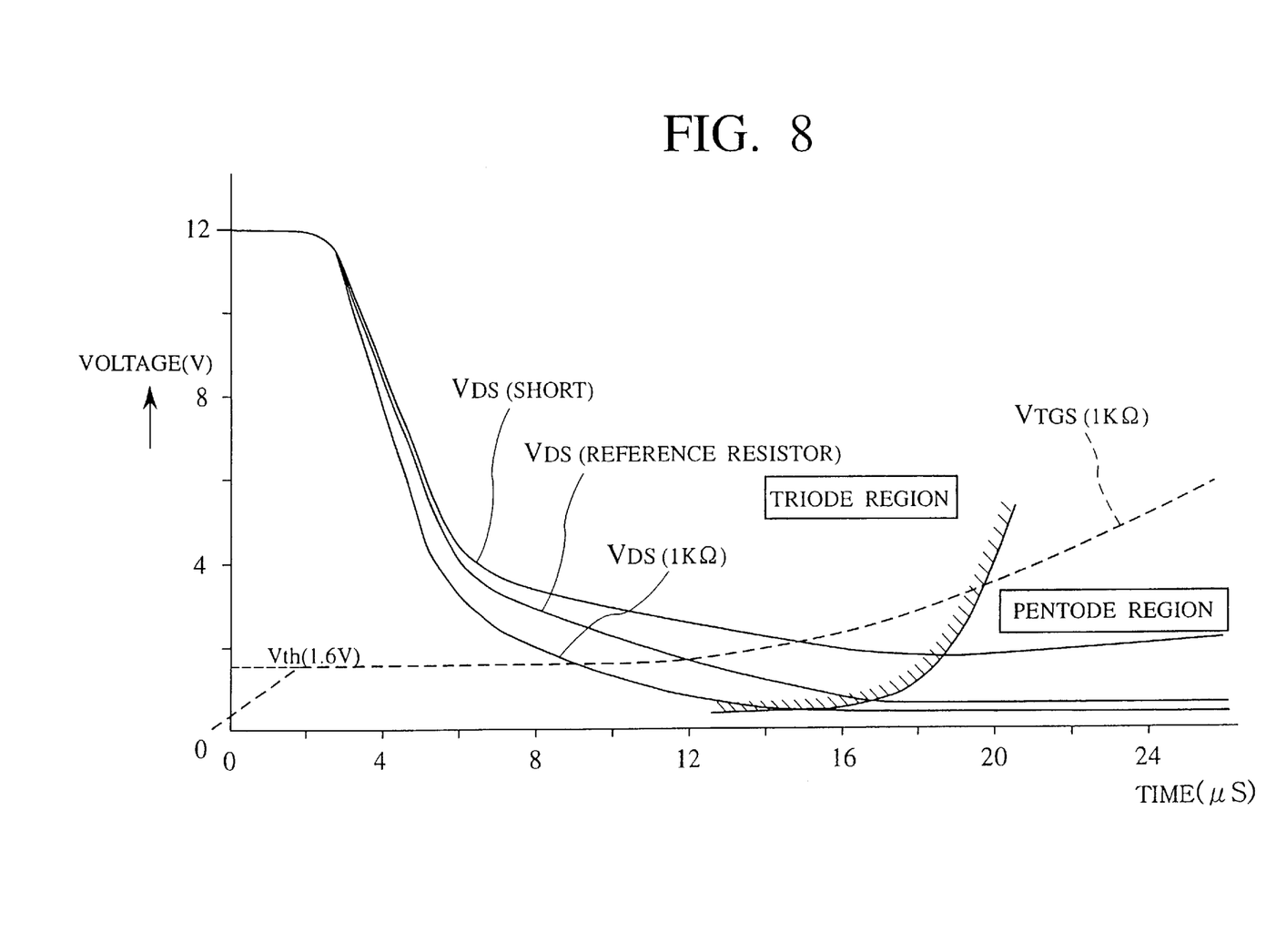
FIG. 8. is a graph showing drain-source-voltage characteristic curves of the current oscillation switching circuit of the present invention during an OFF-to-ON transition state.

FIG. 8 shows characteristic curves of drain-source voltage $V_{DS}$ of the first semiconductor element QA when the element QA changes from OFF to ON with the load 102 being short-circuited, being under a normal operating condition, and being in a state having a resistance value of 1 KΩ. The characteristic curves are dependent on the impedance of the power supply path including the wiring inductance and resistance of the power supply path that includes the element QA.

The drain-source voltage $V_{DS}$ curve with the load 102 having a resistance value of 1 KΩ will be explained. In this example, the first semiconductor element QA is HAF2001 of HITACHI company. Due to the characteristics of this element, a true gate-source voltage $V_{TGS}$ is substantially maintained at a threshold voltage of 1.6 V when a drain current $I_D$ is 12 mA. The driver 111 continuously charges the true gate TG of the first semiconductor element QA. Accordingly the true gate-source voltage $V_{TGS}$ will increase, if nothing happens. However, the drain-source voltage $V_{DS}$ decreases to increase the true gate-drain capacitance $C_{GD}$, to absorb charge, thereby preventing the true gate-source voltage $V_{TGS}$ from increasing. As a result, the true gate-source voltage $V_{TGS}$ is maintained at about 1.6 V. Namely, after the first semiconductor element QA is changed to ON, the drain-source voltage $V_{DS}$ absorb charge supplied by the driver 111 to the gate G and maintains the voltage $V_{TGS}$ at the true gate TG at the constant value.

If the load 102 has a resistance value of R that is lower than 1 KΩ the difference between the drain-source voltage $V_{DS}$ with the load resistance value of 1 KΩ and that with the load resistance value of R is $\Delta V_{DS}GAP$. When the load has the resistance value R, there is a true gate-source voltage of $V_{TGS}R$. By detecting charge for $Q_{GD}$ of the following expression (7) from the true gate-source voltage $V_{TGS}R$, the true gate-source voltage $V_{TGS}R$ becomes 1.6 V.

$$Q_{GD}=\Delta V_{DS}GAP \times C_{GD}+(V_{TGS}R-1.6\ V)\times C_{GS} \quad (7)$$

This means that the true gate-source voltage $V_{TGS}$ is increased from 1.6 V by the charge $Q_{GD}$ as expressed as follows:

$$(V_{TGS}R-1.6V)\times C_{GS}+((V_{TSG}R-1.6\ V)-\Delta V_{DS}GAP)\times C_{GD}$$

$$=(\Delta V_{DS}GAP-(V_{TGS}R-1.6\ V))\times C_{GD}$$

$$(V_{TGS}R-1.6\ V)(C_{CS}+2C_{GD})=\Delta V_{DS}GAP\times 2C_{OD}$$

$$\Delta V_{DS}GAP=(V_{TGS}R-1.6\ V)(C_{GS}/2C_{GD}+1) \quad (1)$$

Namely, $\Delta V_{DS}GAP$ is proportional to "$V_{TGS}R-1.6\ V$." If the drain current $I_D$ is zero, the drain-source voltage $V_{DS}$ curve is determined only by the circuit for charging the true gate and mirror capacitance. When the drain current $I_D$ flows, it generates counter electromotive force due to the whole inductance $L_C$ of the circuit. This provides the same effect as an increase in the resistance of the load. When the whole inductance $L_c$ changes, resistance that is equivalent to the inductance is produced, and therefore, the equivalent resistance value of the load never decreases below a constant value, which is determined by the circuit inductance, even if the pure resistance value of the load becomes very small due to, for example, a dead short. As a result, the gradient of a rise of the drain current $I_D$ converges to a constant value, and therefore, the true gate-source voltage $V_{TGS}$ curve also converges.

If the ratio of the channel width of the second semiconductor element QB to that of the first semiconductor element QA is 1:1000 and if a drain current $I_{DQA}$ of the element QA is 5A and a drain current $I_{DQB}$ of the element QB is 5 mA, the drain-source voltage $V_{DS}$ is equal to the true gate-source voltage $V_{TGS}$ in each of the elements QA and QB. Namely, $V_{DSA}=V_{DSB}$ and $V_{TGSA}=V_{TGSB}$, where $V_{DSA}$ and $V_{DSB}$ are the drain-source voltages of the elements QA and QB, respectively, and $V_{TGSA}$ and $V_{TGSB}$ are the true gate-source voltages of the elements QA and QB, respectively.

When the second semiconductor element QB is completely ON, the ends of the first reference resistor Rr substantially receive the source voltage VB. Accordingly, the resistance of the first reference resistor Rr is determined as Rr=12 V/5 mA=2.4 KΩ. Here, the resistance of the first reference resistor Rr serves as load on the second semiconductor element QB and corresponds to the load of 5 A connected to the first semiconductor element QA.

An operation of the switching device of the present invention in a triode region will be explained. When the first semiconductor element QA changes to ON, the drain current $I_{DQA}$ increases to a final load current value determined by circuit resistance. At this time, the true gate-source voltage $V_{TGSA}$ of the element QA is determined by the drain current $I_{DQA}$. The true gate-source voltage $V_{TGSA}$ increases although it is braked by a mirror effect of the capacitance $C_{GD}$ due to a decrease in the drain-source voltage $V_{DSA}$. The second semiconductor element QB operates as a source follower according to a gate voltage determined by the first semiconductor element QA with the resistor Rr serving as a load resistor.

The true gate-source voltage $V_{TGSA}$ of the first semiconductor element QA increases as the drain current $I_{DQA}$ increases. $V_{DSA}=V_{TGSA}+V_{TGD}$ and $V_{DSB}=V_{TGSB}+V_{TGD}$, and therefore, $V_{DSA}-V_{DSB=VTGSA-VTGSB=(IDQA-n\times IDQB)}/Gm$, where Gm is the transfer conductance of the first semiconductor element QA and n is a channel width ratio between QA and QB.

Accordingly, by detection the difference "$V_{DSA}-V_{DSB}$" between the drain-source voltages, the drain current difference "$I_{DOA}-n\times I_{DOB}$" is obtainable.

The drain-source voltage $V_{DSB}$ of the second semiconductor element QB is directly supplied to the comparator CMP1. The drain-source voltage $V_{DSA}$ of the first semiconductor element QA is divided by the resistors R1 and R2, and the divided voltage is supplied to the comparator CMP1. The voltage $V_+$ applied to the positive input terminal of the comparator CMP1 is expressed as follows without considering the variable resistor RV:

$$V_{30}=V_{DSA}\times R1/(R1+R2) \quad (2)$$

If the load is normal, Rr/n<R, where R is the load resistance. Accordingly, $V_+<V_{DSB}$ to keep the first semiconductor element QA ON. If the load is in an overload state, then Rr/n>R. Accordingly, the first semiconductor element QA is turned off in an ohmic region. Once the first semiconductor element QA is turned off, source potentials $V_{SA}$ and $V_{SB}$ of the first and second semiconductor elements QA and QB decrease toward the ground potential GND to increase $V_{DSA}$ and $V_{DSB}$. Before $V_{SA}$ and $V_{SB}$ reach the ground potential GND, $V_{30}<V_{DSB}$ is established to again turn on the first semiconductor element QA. Just after the first semiconductor element QA is turned on, the element QA is in a pinch-off region. The first semiconductor element QA keeps the ON state toward the ohmic region and is turned off when $V_{30}>V_{DSB}$ is established. These operations form an ON/OFF cycle. Keeping an OFF state once turned off and keeping an ON state once tuned on are due to the inductance of the load. This inductance works like a resistor with respect to a current change. With respect to a decreasing current, the equivalent resistor has a negative sign to decrease the resistance of the load, and with respect to an increasing current, the equivalent resistor has a positive sign to increase the resistance of the load. This is the reason why the first semiconductor element QA keeps and ON or OFF state once it is turned on or off. The resistance Rr of the second semiconductor element QB of the reference circuit is n times greater than the load resistance R, and therefore, the inductance effect on the second semiconductor element QB is very small and ignorable. Accordingly, the circuit involving the second semiconductor element QB is considered to be a pure resistance circuit.

For the comparator CMP1, the diode D1 and resistor R5 form hysteresis. When the first semiconductor element QA changes to OFF, the sink transistor Q6 of the driver 111 grounds the gate potential, and the cathode potential of the diode becomes $V_{SA}$ −0.7 V (a forward voltage of the zener diode ZD1), to make the diode D1 conductive. As a result, current passes from the resistor R1 to the resistor R5 to the diode D1. The signal $V_+$ to the positive input terminal of the comparator CMP1 becomes greater than a value determined by the expression (2) with the drive 111 carrying out ON control. The first semiconductor element QA keeps the OFF state until the drain-source voltage difference $V_{DSA}-V_{DSB}$ reaches a predetermined level. Thereafter, $V_{DSA}$ increases further so that the signal $V_+$ may become smaller than $V_{DSB}$. Then, the output of the comparator CMP1 changes from low to high to again turn on the first semiconductor element QA. The comparator CMP1 may have various hysteresis characteristics. The hysteresis mentioned above is only an example.

By setting the drain-source voltage $V_{DSA}$ of the first semiconductor element QA that changes to OFF as a threshold value $V_{DSth}$, the following is established:

$$V_{DSAth} - V_{DSB} = R2/R1 \times V_{DSB} \qquad (3)$$

An overcurrent determining value in the triode region is determined by the expression (3).

An operation of the switching device of the present invention in the pentode region will be explained. If there is no trouble in wiring, the first semiconductor element QA keeps ON once it is turned on. Accordingly, after the true gate-source voltages $V_{TGSA}$ and $V_{TGSB}$ exceed each a pinch-off voltage, the elements QA, QB, and QC operate in the pentode region. In the case of HAF2001 of HITACHI company, the ON resistance $R_{DS(ON)}$ is 30 mΩ when the gate-source voltage $V_{TGSA}$ is 10 V. Therefore, the following is obtained:

$$V_{DSB} = 5A \times 30[m\Omega] = 0.15[V] \qquad (4)$$

$$V_{DSA} = I_{DQA} \times 30[m\Omega] \qquad (5)$$

$$V_{DSA} - V_{DSB} = 30[m\Omega] \times (I_{DQA} - 5[A]) \qquad (6)$$

If a wiring short circuit occurs to increase the drain current $I_{DQA}$, the value of the expression (6) becomes larger, and if the drain current exceeds the overcurrent determination value, the first semiconductor element QA is changed to OFF. In this case, the first semiconductor element QA passes through the pinch-off point and the operation in the triode region and changes to OFF. Due to the hysteresis defined by the diode D1 and resistor R5 of FIG. 4, The signal $V_+$ to the positive input terminal of the comparator CMP1 becomes smaller than $V_{DSB}$ after a predetermined period of time. As a result, the output of the comparator CMP1 changes from low to high, to again change the first semiconductor element QA to ON. In this way, the first semiconductor element QA is repeatedly turned on and off, and finally, is turned off due to overheat. When the wiring restores a normal state (in the case of an intermittent short circuit) before the first semiconductor element QA is turned off due to overheat, the element QA is made to keep ON.

Figure 9A:
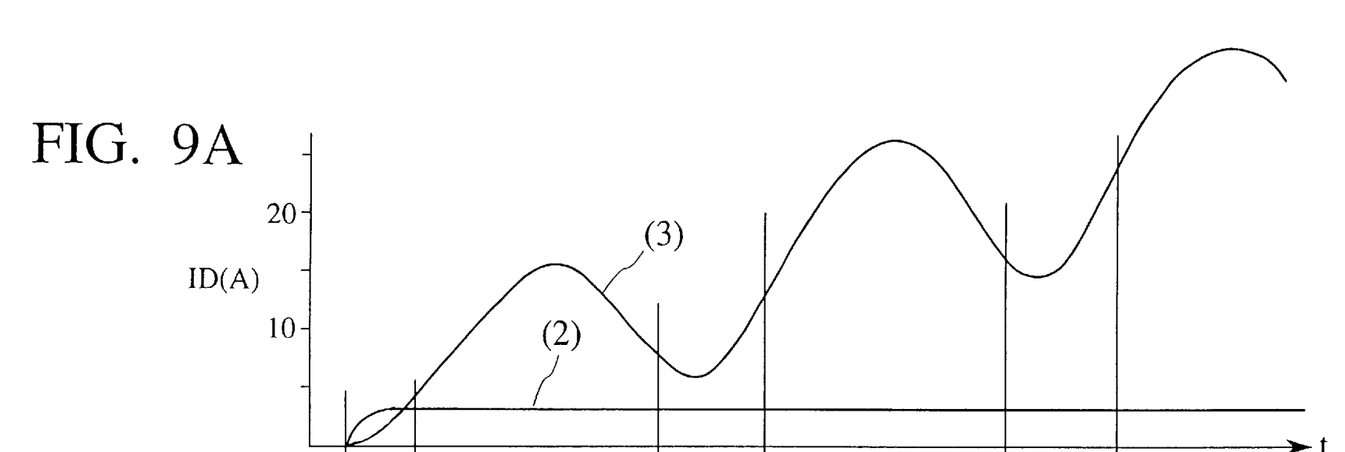
FIG. 9A is a graph showing drain-current characteristic curves of the first semiconductor element in the current oscillation switching circuit of the present invention during a transition state.
Figure 9B:
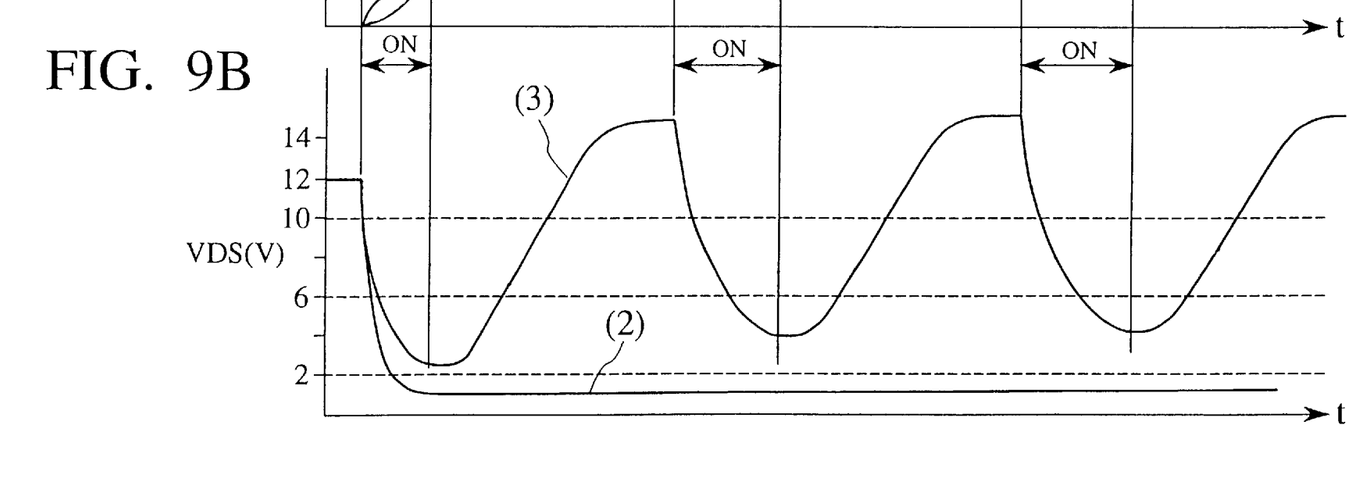
FIG. 9B is a graph showing drain-source-voltage characteristic curves corresponding to the curves of FIG. 9A.

FIG. 9A shows a drain current $I_D$ of the current oscillation switching circuit of the present invention, and FIG. 9B shows a drain-source voltage $V_{DS}$ corresponding to the drain current $I_D$. In FIGS. 9A and 9B, curves (3) represent an overload state and (2) a normal state. Under the overload state (3), the first semiconductor element QA is repeatedly turned on and off as mentioned above to largely fluctuate the drain current $1_D$ as indicated with the curves (3). This results in cyclically heat the first semiconductor element QA, so that the element QA is turned off due to overheat.

In summary, the switching device of the present invention needs no shunt resistor for detecting a current in a power supply path, thereby detecting negligible currents such as the leakage current at the good accuracy, reducing a heat loss and quickly responding to an abnormal current caused by an incomplete short circuit such as a layer short having a certain extent of short-circuit resistance. This switching device is easy to integrate and is manufacturable at low cost.

The switching device of the present invention is capable of detecting a leak current that may flow even when the load is an OFF state and when other electric power supply controller is made to be an OFF state. Namely, the switching device of the present invention easily monitors an increase in the leak current.

ON/OFF control parts of the switching device of the present invention may monolithically integrated to eliminate a microcomputer. This arrangement greatly reduces a chip area as well as cost.

Compared with the prior art that monitors a drain-source voltage $V_{DS}$ and compares it with a threshold at predetermined timing to detect an overcurrent, the present invention needs reduced numbers of capacitors and resistors, thereby minimizing detection errors due to parts variations. In addition, the current oscillation switching circuit 110 of the present invention formed on a chip needs no external capacitor, thereby reducing the space and cost of the switching device.

The present invention sets the current capacity of the second semiconductor element QB to be smaller than that of the first semiconductor element QA, so that the ratio of the resistance of load to that of the second resistor may substantially be inverse proportion to the ratio of the current capacity of the first semiconductor element QA to that of the second semiconductor element QB. This arrangement reduces the size of the second semiconductor element QB and second resistor, thereby reducing the size and cost of the switching device.

The overheat protective function of the present invention turns off the switching device if the switching device overheats. When an incomplete short circuit having a certain extent of short-circuit resistance occurs, the first semiconductor element QA is repeatedly turned on and off to greatly vary a current. This cyclically heats the element QA, so that the overheat protective function may quickly turn off the element QA. Consequently, the switching device of the present invention quickly responds to an abnormal current caused by an incomplete short circuit.

What is claimed is:

1. An apparatus for detecting a weak current, comprising a switching device that includes:
   a first semiconductor element having a first main electrode, a second main electrode, and a control electrode;

a second semiconductor element having a first main electrode connected to the first main electrode of the first semiconductor element, a control electrode connected to the control electrode of the first semiconductor element, and a second main electrode connected to a first resistor;

a first comparator for comparing second main-electrode voltages of the first and second semiconductor elements with each other;

control means for supplying a control voltage to the control electrodes of the first and second semiconductor elements according to an output of the first comparator;

a third semiconductor element having a first main electrode connected to the first main electrode of the first semiconductor element, a control electrode connected to the control electrode of the first semiconductor element, and a second main electrode connected to a second resistor; and a second comparator for comparing second main-electrode voltages of the first and third semiconductor elements with each other, the transistor widths of the second and third semiconductor elements being each smaller than the transistor width of the first semiconductor element, the switching device being connected to power supply controllers in parallel with one another between a power source and a load, the switching device being operated alone to detect a weak current when the load and power supply controllers are OFF and having an over-current protection function.

2. The apparatus of claim 1, wherein a resistance value provided when the switching device is operated alone is set to be greater than a resistance value provided when the power supply controllers are operated alone.

* * * * *

UNITED STATES PATENT AND TRADEMARK OFFICE
CERTIFICATE OF CORRECTION

PATENT NO.   : 6,313,690 B1
DATED        : November 6, 2001
INVENTOR(S)  : Shunzou Ohshima It is certified that error appears in the above-identified patent and that said Letters Patent is hereby corrected as shown below:

<u>Title page,</u>
Item [54], in the Title, "JUNCTION" should read -- FUNCTION --.

Signed and Sealed this

Sixteenth Day of July, 2002

*Attest:*

*Attesting Officer*

JAMES E. ROGAN
*Director of the United States Patent and Trademark Office*